(12) United States Patent
Clevenger et al.

(10) Patent No.: US 7,473,979 B2
(45) Date of Patent: Jan. 6, 2009

(54) SEMICONDUCTOR INTEGRATED CIRCUIT DEVICES HAVING HIGH-Q WAFER BACK-SIDE CAPACITORS

(75) Inventors: Lawrence Clevenger, LaGrangeville, NY (US); Timothy Joseph Dalton, Ridgefield, CT (US); Louis Hsu, Fishkill, NY (US); Carl Radens, LaGrangeville, NY (US); Vidhya Ramachandran, Ossining, NY (US); Keith Kwong Hon Wong, Wappingers Falls, NY (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 88 days.

(21) Appl. No.: 11/443,394

(22) Filed: May 30, 2006

(65) Prior Publication Data
US 2007/0278619 A1 Dec. 6, 2007

(51) Int. Cl.
*H01L 29/92* (2006.01)
(52) U.S. Cl. .............................. 257/532; 257/E29.343; 438/957
(58) Field of Classification Search ................. 257/532
See application file for complete search history.

(56) References Cited

U.S. PATENT DOCUMENTS

| | | | |
|---|---|---|---|
| 5,770,875 A | 6/1998 | Assaderaghi et al. ........ 257/301 |
| 5,811,868 A * | 9/1998 | Bertin et al. ................. 257/516 |
| 6,061,228 A * | 5/2000 | Palmer et al. ............ 361/306.2 |
| 6,236,103 B1 * | 5/2001 | Bernstein et al. ............ 257/532 |
| 6,297,090 B1 * | 10/2001 | Kim ........................... 438/253 |
| 6,337,253 B1 | 1/2002 | Davari et al. ................ 438/393 |
| 6,465,331 B1 * | 10/2002 | Keeth et al. ................. 438/479 |
| 6,492,244 B1 * | 12/2002 | Christensen et al. ........ 438/404 |
| 7,388,274 B2 * | 6/2008 | Aitken et al. ................ 257/532 |
| 2003/0001232 A1 * | 1/2003 | Koinuma et al. ............ 257/532 |

\* cited by examiner

*Primary Examiner*—Evan Pert
*Assistant Examiner*—Ben P Sandvik
(74) *Attorney, Agent, or Firm*—Robert M. Trepp; F. Chau & Associates, LLC

(57) ABSTRACT

Methods are provided for fabricating semiconductor IC (integrated circuit) chips having high-Q on-chip capacitors formed on the chip back-side and connected to integrated circuits on the chip front-side using through-wafer interconnects. In one aspect, a semiconductor device includes a semiconductor substrate having a front side, a back side, and a buried insulating layer interposed between the front and back sides of the substrate. An integrated circuit is formed on the front side of the semiconductor substrate, an integrated capacitor is formed on the back side of the semiconductor substrate, and an interconnection structure is formed through the buried insulating layer to connect the integrated capacitor to the integrated circuit.

19 Claims, 16 Drawing Sheets

SEMICONDUCTOR INTEGRATED CIRCUIT DEVICES HAVING HIGH-Q WAFER BACK-SIDE CAPACITORS

TECHNICAL FIELD OF THE INVENTION

The present invention relates generally to methods for fabricating semiconductor IC (integrated circuit) chips having high-Q on-chip capacitors and, more specifically, semiconductor IC chips having high-Q capacitors that are formed on the chip back-side and connected to integrated circuits on the chip front-side using through-wafer embedded interconnects.

BACKGROUND

In general, capacitors are components that are commonly used in chip fabrication and packaging designs for various purposes. For instance, on-chip capacitors are fundamental components for constructing semiconductor integrated circuits including, for example, memory arrays, charge pumps, RC filters, peaking amplifiers and various types of analog integrated circuits. In addition, capacitors are used in integrated circuits and chip packages for purposes of AC coupling and DC blocking. For example, capacitors can be implemented as series elements that couple RF energy from one part of a circuit to another part while blocking DC signals. In particular, in RF amplifier designs, DC blocking capacitors are used for interconnecting RF amplifier stages Moreover, capacitors are commonly used in chip fabrication/package designs as decoupling capacitors to stabilize power supply voltages, i.e., minimize or eliminate power jitter. Indeed, high performance circuits require high capacitance, high quality (Q), and low-impedance decoupling capacitors between a DC power supply and ground lines to limit noise created by rapid switching of current, where such noise results from, inductive and capacitive parasitic impedances. The ability to reduce or eliminate such noise is particularly important for mixed-mode product designs (analog/digital), where it is necessary to work with very low signals. Insufficient decoupling capacitance can result in high power supply and ground noise.

In conventional designs, DC blocking and decoupling capacitors are implemented as discrete, off-chip components that are mounted inside a chip package module or on an electrical board (e.g., printed circuit board) on which a chip is mounted. Continuing advances in semiconductor IC chip fabrication and packaging technologies, however, is allowing the development of high-performance IC chips and chip package structures with increasingly higher levels of integration density, and lower fabrication costs. In this regard, IC chip and package designs utilize on-chip DC blocking and decupling capacitors, for example, to reduce chip package cost and to reduce module size. Moreover, the use of on-chip decoupling capacitors, for example, allows for higher performance designs as on-chip decoupling capacitors are more effective in reducing noise in power and ground lines when placed closer to the relevant loads.

Depending on the application, however, the use of on-chip capacitors can be problematic. For example, with high-density chip designs, there can be limited 2D/3D silicon space on the chip for building the integrated capacitors, resulting in practical limitations in integration density. Consequently, to achieve a desired level of integration for a given design, the sizes of the on-chip capacitors may be reduced, resulting in decreased performance. Moreover, the type of on-chip capacitor that is used in a given design may limit the level of performance and/or integration density achievable. For example, high-performance chips are typically fabricated using capacitor technologies that yield high quality factor (Q) capacitors, but such technologies do not scale well as integration density increases, as higher integration results in formation of capacitors with relatively poor performance due to increased parasitic impedances and plate resistance. Other capacitor technologies enable high-integration designs, but result in lower quality capacitors that are not useful in high-performance applications.

For instance, deep-trench or stacked capacitor techniques that are used in DRAM technology can be used to achieve high capacitance density, but can result in low quality capacitors. For instance, with such technologies, the thin dielectric layers that are formed on capacitor trench sidewalls and 3D-structures can not sustain high-voltage stress and thus, susceptible to breakdown. To address this problem, several capacitors must be serially connected to obtain an effective capacitance, but this technique results in four times increase in the area needed to construct the capacitors, and increase the cost of fabrication. Other conventional techniques using planar or 3-D MIM (metal-insulation-metal) capacitor, interdigitated structure, etc., may be used to form high-quality capacitors, but at the expense of consuming valuable silicon real estate on the chip front side.

SUMMARY OF THE INVENTION

Exemplary embodiments of the invention generally include methods for fabricating semiconductor IC (integrated circuit) chips having high-Q on-chip capacitors formed on the chip back-side and connected to integrated circuits on the chip front-side using through-wafer interconnects that link back side capacitors to the circuits and devices located in the front of a semiconductor wafer.

In one exemplary embodiment of the invention, a semiconductor device includes a semiconductor substrate having a front side, a back side, and a buried insulating layer interposed between the front and back sides of the substrate. An integrated circuit is formed on the front side of the semiconductor substrate, an integrated capacitor is formed on the back side of the semiconductor substrate, and an interconnection structure is formed through the buried insulating layer to connect the integrated capacitor to the integrated circuit. In one embodiment, the semiconductor substrate is SOI (silicon on insulator) structure.

In another exemplary embodiment, the interconnection structure is a buried metallic plug having a first end connected to the integrated circuit on the front side of the substrate and a second end connected to metallic capacitor plate of the integrated capacitor on the back side of the substrate, wherein the second end of the buried metallic plug is substantially coplanar with a back side surface of the buried insulation layer. The first end of the buried metallic plug can be connected to an I/O pad or power supply pad formed on a surface of the front side of the substrate.

In one exemplary embodiment, the integrated capacitor is a stacked structure with first and second metallic plates and a capacitor dielectric layer disposed between the first and second metallic plates. In particular, in one embodiment, the integrated capacitor is a stacked structure formed on a back side surface of the buried insulating layer, wherein the first metallic plate is stacked on the back side surface of the buried insulating layer and in direct contact with the end of the buried contact plug exposed on the back side surface of the buried insulating layer. The integrated capacitor may be a DC blocking capacitor or a decoupling capacitor, for example. The first and second metallic plates may be electrically connected to end portions of separate first and second interconnection structures exposed on the back side of the substrate through the buried insulating layer.

In one exemplary embodiment of the invention, the first and second metallic plates are formed in a capacitor region defined by insulating material on the backside the substrate surrounding the first and second metallic plates, wherein the capacitor region is defined by a trench formed in an insulating layer on the backside of the substrate.

In another exemplary embodiment, the first and second metallic plates are formed in a capacitor region defined by semiconductor material on the back side of the substrate surrounding the first and second metallic plates, wherein the capacitor region is defined by a trench formed in a layer of silicon on the backside of the substrate.

In another exemplary embodiment of the invention, a method of forming a semiconductor device includes providing a SOI (silicon on insulator) substrate having a buried insulating layer interposed between an active silicon layer on a front side of the SOI substrate and a bulk silicon layer on a back side of the SOI substrate, and forming an integrated circuit on the front side of the SOI substrate, wherein the integrated circuit comprise a buried contact plug that extends from the front side of the SOI substrate through the buried insulating layer. A back side etch process is then performed to form a trench in the bulk silicon layer and expose an end portion of the buried contact plug on a backside surface of the buried insulating layer, and a capacitor is formed in the trench. The capacitors includes a first capacitor plate, a second capacitor plate and a capacitor dielectric layer interposed between the first and second capacitor plates, wherein the first capacitor plate is formed to make contact to the exposed end portion of the buried contact plug.

In yet another embodiment of the invention, a method of forming a semiconductor device includes providing a SOI (silicon on insulator) substrate having a buried insulating layer interposed between an active silicon layer on a front side of the SOI substrate and a bulk silicon layer on a back side of the SOI substrate, forming an insulating frame structure in the bulk silicon layer that defines a boundary of a capacitor region and forming an integrated circuit on the front side of the SOI substrate, wherein the integrated circuit comprise a buried contact plug that extends from the front side of the SOI substrate through the buried insulating layer aligned to the capacitor region on the back side of the SOI substrate. A back side etch process is performed to form a trench in the bulk silicon layer bounded by the insulating frame structure and expose an end portion of the buried contact plug on a backside surface of the buried insulating layer, and a capacitor is formed in the trench. The capacitor includes a first capacitor plate, a second capacitor plate and a capacitor dielectric layer interposed between the first and second capacitor plates, wherein the first capacitor plate is formed to make contact to the exposed end portion of the buried contact plug.

These and other exemplary embodiments, aspects, features and advantages of the present invention will be described or become apparent from the following detailed description of exemplary embodiments, which is to be read in connection with the accompanying drawings.

DETAILED DESCRIPTION OF EXEMPLARY EMBODIMENTS

Exemplary embodiments of the invention will be discussed in further detail hereafter regarding semiconductor IC chips having high-quality, integrated capacitors that are fabricated on the chip back-side and connected to integrated circuits on the chip front-side using through-wafer interconnects. For example, exemplary chip fabrication techniques according to the invention as discussed below include methods for constructing large-size, high-quality capacitor structures on the back side of a semiconductor SOI (silicon-on-insulator) wafer while preserving the front side silicon real estate for achieving high density integration chip design. As discussed in detail below, exemplary chip fabrication techniques enable formation of high-quality capacitors with good dielectric integrity, low plate resistance and minimal or no parasitic impedances.

Figure 1:
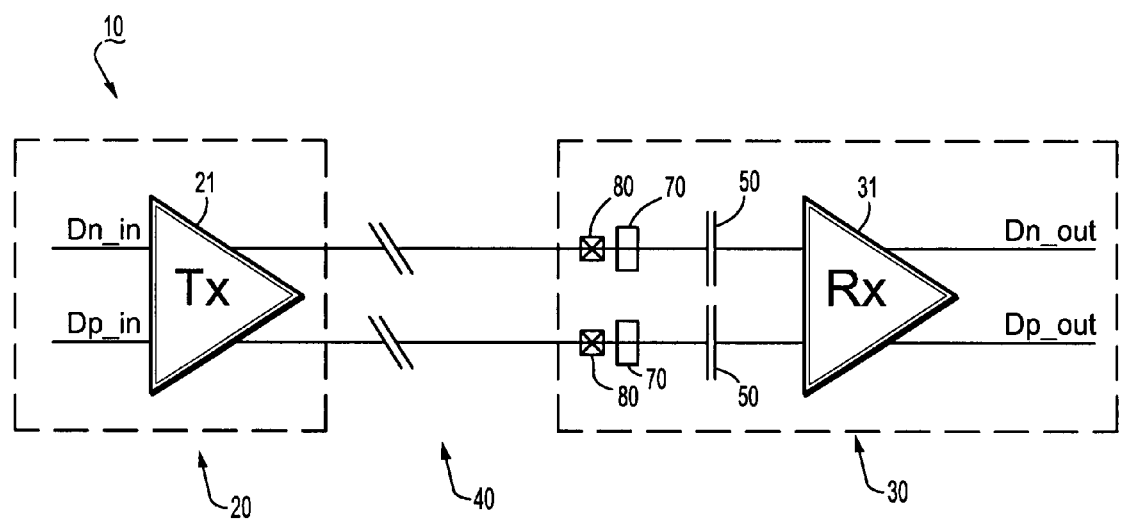
FIG. 1 is schematic diagram of a Serializer-Deserializer (SerDes) circuit that can be designed using on-chip backside capacitors according to an exemplary embodiment of the invention.

FIG. 1 schematically illustrates a Serializer-Deserializer (SerDes) module (10) having IC chips that can be fabricated with on-chip capacitors according to an exemplary embodiment of the invention. In general, the SerDes module (10) includes a serializer circuit (20) and a deserialzier circuit (30) connected through a transmission medium (40). The serializer circuit (20) includes a transmitter (21) and the deserialzier circuit (30) comprises a receiver (31). The serializer (20) converts a low-speed parallel data bus into a high-speed, serial data stream that is transmitted by the transmitter (21) through a transmission medium (20) and received by the receiver (31). The deserializer circuit (30) converts the high-speed serial data stream into the original parallel format. FIG. 1 illustrates a conventional design in which the transmitter (21) transmits a serial data stream of complementary data bit pairs, Dn_in and Dp_in, to the receiver (31) which outputs the serial data stream of complementary bit pairs DN_out and Dp_out for conversion to parallel format.

The SerDes module (10) may be constructed where the serializer circuit (20) and deserializer circuit (30) are formed on separate IC chips that are integrally packaged on a common package substrate, or separately packaged on different substrates, where the transmission media (40) may be a cable connection for transmitting data between the different IC chips on different PCBs (printed circuit boards) or micro strip traces providing interconnections between IC chips on the same PCB.

Figure 2A:
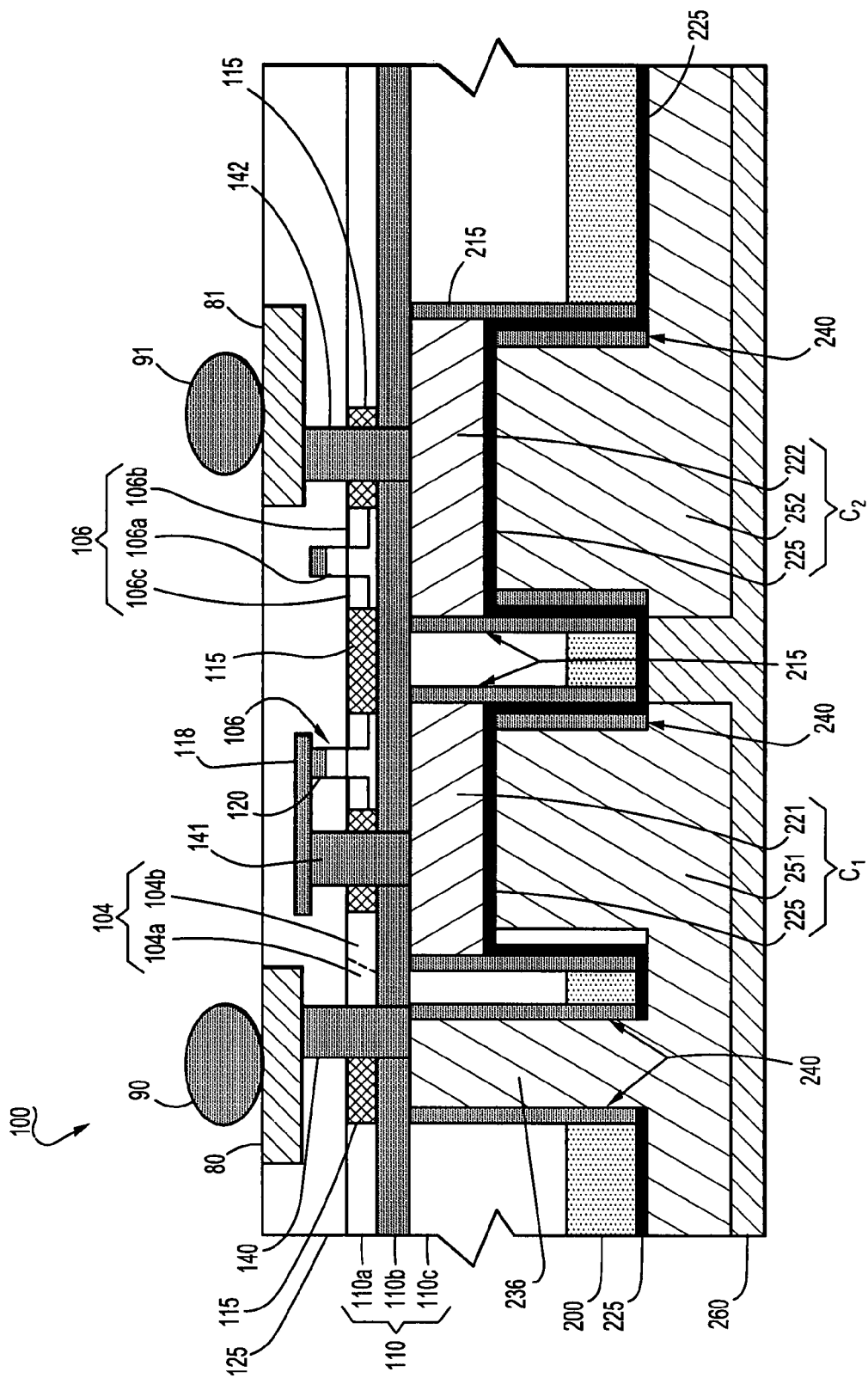
FIGS. 2A~2C schematically illustrate a semiconductor IC chip having on-chip back side capacitors according to an exemplary embodiment of the invention.
Figure 2B:
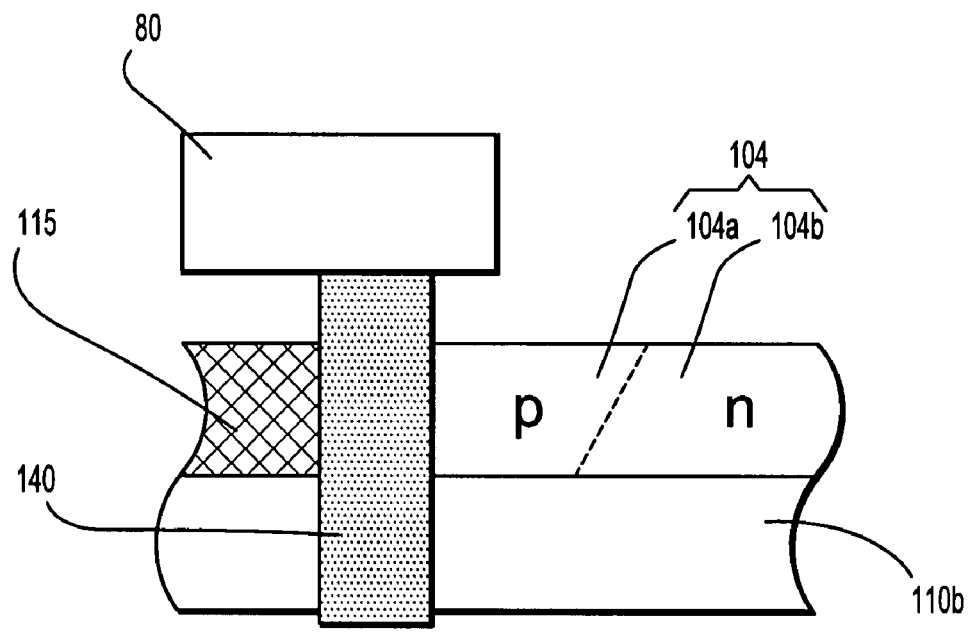
Figure 2C:
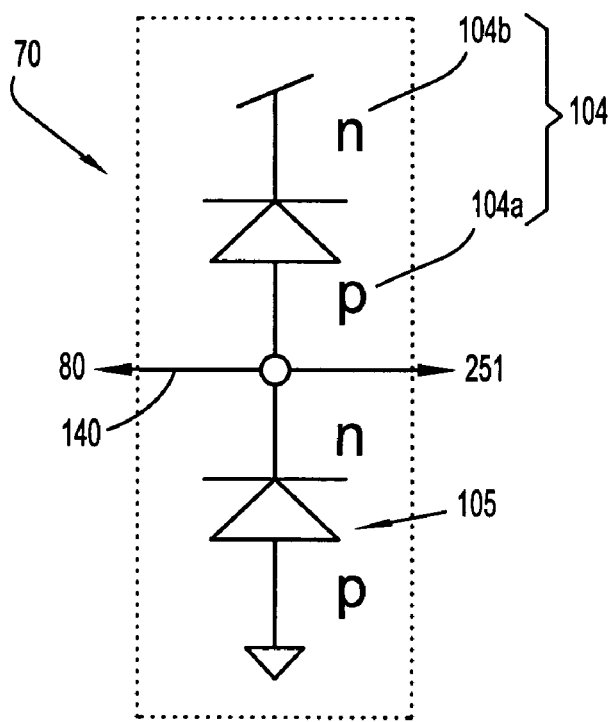

The deserializer circuit (30) comprises a pair of input pads (80) and on chip ESD (electro-static discharge) devices (70) and DC blocking capacitors (50) integrally formed as part of the integrated deserializer circuit (30). The DC blocking capacitors (50) are required when operating in the AC coupling mode, and would allow designers to pick a common mode level which is optimized to the receiver (31) regardless the common mode level set by the transmitter (21). In the exemplary embodiment of FIG. 1, the ESD devices (70) are interconnected between the input pads (80) and the on-chip DC blocking capacitors (50). Moreover, on chip DC decoupling capacitors can be formed as part of the integrated circuit (30). The on chip DC blocking and decoupling capacitors can be fabricated using exemplary embodiments discussed below, which yield low impedance, on chip capacitors for high-performance applications and which preserve valuable silicon real estate for high integration density chip and package designs. To continue the previous example of integrating DC blocking capacitors on the receiver core, two embodiments of step-by-step fabrication procedures and corresponding diagrams are described in the following session:

FIGS. 2A~2C schematically illustrate a semiconductor IC chip (100) having integrated capacitors according to an exemplary embodiment of the invention. More specifically, FIG. 2A is a schematic cross-sectional side view of a portion of an IC chip (100) having high-Q capacitors that are formed on the chip back-side (non-active surface) and connected to integrated circuits on the chip front-side (active surface) using through-wafer embedded interconnects. For illustrative purposes, FIG. 2A can be viewed as an exemplary embodiment of the front-end of the receiver (31) of the integrated circuit (30) of FIG. 1, which depicts exemplary structures for the input pads (80), ESD devices (70) and on-chip DC blocking capacitors (50) and their interconnections, as well as on-chip decoupling capacitors. Moreover, as further explained below, FIGS. 2B and 2C are schematic illustrations of an exemplary embodiment of an ESD device (70) and the interconnection to an input pad (80) and a backside DC blocking capacitor.

Referring now to FIG. 2A, the exemplary semiconductor IC chip (100) generally comprises a semiconductor substrate (110) (or wafer) having an front-side (or active surface) and a back-side (or non-active surface), wherein the front-side of the substrate (110) comprises an integrated circuit formed by FEOL (front-end-of-line) and BEOL (back-end-of-line) structures, and wherein the back-side of the substrate (110) comprises integrated capacitors connected to the front-side integrated circuit by an interconnection structure formed through the semiconductor substrate (110). The semiconductor substrate (110) comprises a SOI (silicon on insulator) substrate (110) (or wafer) comprising a thin surface layer of silicon (110a) and a buried oxide (BOX) layer (110b) stacked on a bulk silicon layer (110c) (which may also be referred to as a carrier layer or a support layer, for example).

On the front-side of the chip, STI (shallow trench isolation) regions (115) are formed in the upper silicon layer (110a) to define active regions of silicon in which circuit devices (104) and (106) are formed. The devices (106) are depicted as MOS transistors having a polysilicon gate structure (106a) and source/drain diffusion regions (106b/106c). The active device (104) is a diode having a P-doped region (104a) and n-doped region (104b) (which forms part of an ESD device (70) as discussed below with reference to FIGS. 2B and 2C). The active circuit components (104) and (106) are electrically isolated from the bulk wafer (110c) and from each other by the BOX layer (110b) and the STI regions (115). In the exemplary embodiment, the STI regions (115) are formed down to the BOX layer (110b) such that the SOI completely isolates each active component (104), (106) from neighboring components. The circuit components (104), (106) and STI regions (115) may be formed using standard FEOL fabrication techniques such as dopant diffusion and implantation, sputtering of polysilicon gate films, oxidations, and associated patterning steps.

Moreover, a front-side interconnection structure is formed using standard BEOL (back-end of line) fabrication techniques to connect the circuit devices together. The front side interconnection structure comprises various levels of metallization providing contact plugs (120) made to the gates elements (106a), electrical wiring (118), and I/O pads (80) and (81), which are embedded in one or more layers of dielectric/insulation material (125). A plurality of solder balls (90) and (91) are formed on respective I/O pads (80) and (81) enabling flip chip bonding of the IC chip (100) to respective contacts on a PCB or package substrate, for example. Moreover, plurality of through-wafer contact plugs (140, 141, 142) are formed through the BOX layer (110b) to provide interconnections between the front-side integrated circuit and capacitor structures formed on the back-side side of the chip (100).

More specifically, a plurality of back-side integrated capacitor structures are formed in the bulk wafer layer (110c) with electrodes that contact the end portions of the through wafer contact plugs (140~142). A hard mask pattern (200) is used as an etch mask to define and etch trenches in the bulk wafer silicon (110c) to define the capacitor regions and electrode contacts, which are aligned to through-wafer plugs. A plurality of insulating sidewall spacers (215) and (240) are formed to insulate the bulk silicon (110c) from the capacitor structure and prevent shorts between backside capacitor electrodes. A first backside metallization process forms capacitor electrodes (221) and (222) that contact the ends of respective through-wafer plugs (141) and (142). A second backside metallization forms capacitor electrodes (251) and (252). A layer of dielectric material (225) is deposited to form capacitor dielectric layers. A back-side passivation layer (260) is formed to protect and isolate the capacitor electrodes (251) and (252).

In the exemplary embodiment of FIG. 2A, a first backside capacitor structure C1 is formed by the first capacitor electrode (221) and second capacitor electrode (251) and the portion of the dielectric layer (225) interposed between the first and second electrodes (221) and (251). Moreover, a second backside capacitor structure C2 is formed by the first capacitor electrode (222) and the second capacitor electrode (252) and the portion of the dielectric layer (225) interposed between the first and second electrodes (222) and (252). In one exemplary embodiment, the backside capacitor C2 may be a decoupling capacitor between DC power supply and ground, wherein the through wafer plug (142) connects the first electrode (222) to I/O pad (81) to which DC power is applied, and wherein the second electrode (252) is connected to ground.

Moreover, the backside capacitor C1, which is serially connected between through-wafer plugs (140) and (141), is one exemplary embodiment of the on-chip DC blocking capacitor (50) at the input of the receiver circuit (31) in FIG. 1. By way of specific example, referring to FIGS. 2B and 2C, an exemplary embodiment of the ESD device (70) includes two p-n diodes (104) and (105) serially connected between power supply and ground, where an n-terminal of the diode (104) is connected to power supply and a p-terminal of the diode (105) is connected to ground. The through-wafer plug (140) provides an electrical interconnect between the p-terminal of diode (104), the n-terminal of diode (105), the I/O pad (80) and the second electrode (251) of the capacitor (C1).

Figure 3A:
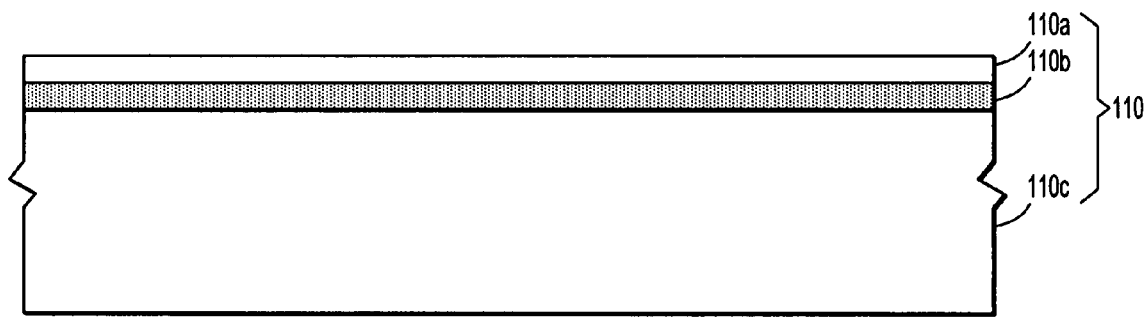
FIGS. 3A~3O schematically illustrate a method for fabricating a semiconductor IC chip having on-chip back side capacitors according to an exemplary embodiment of the invention.
Figure 3B:
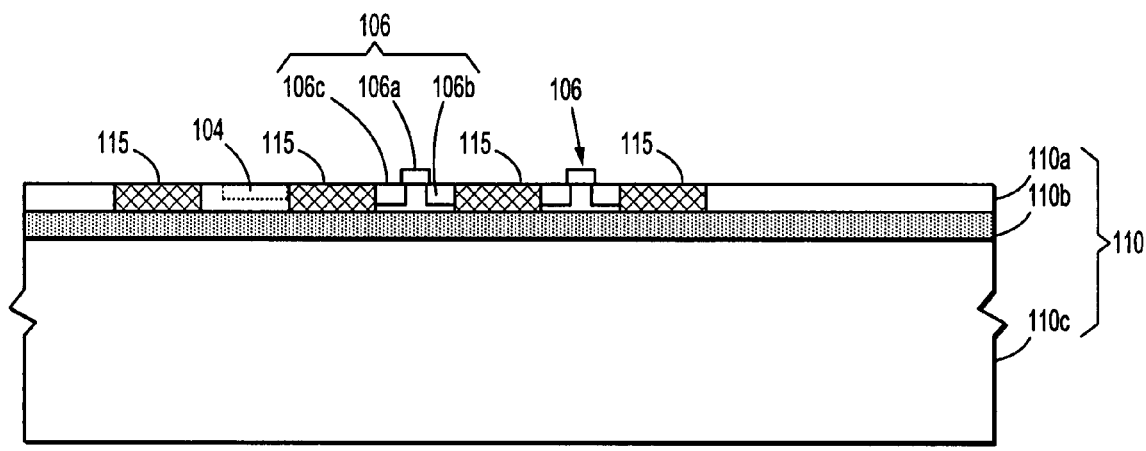
Figure 3C:
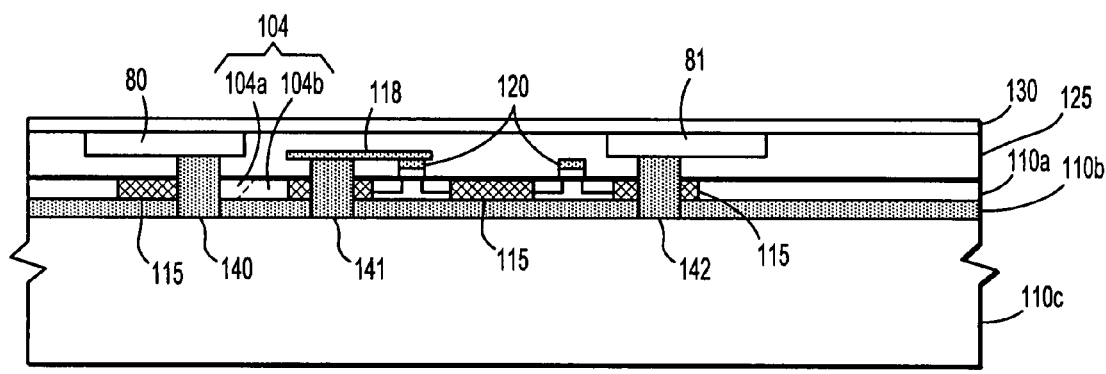
Figure 3D:
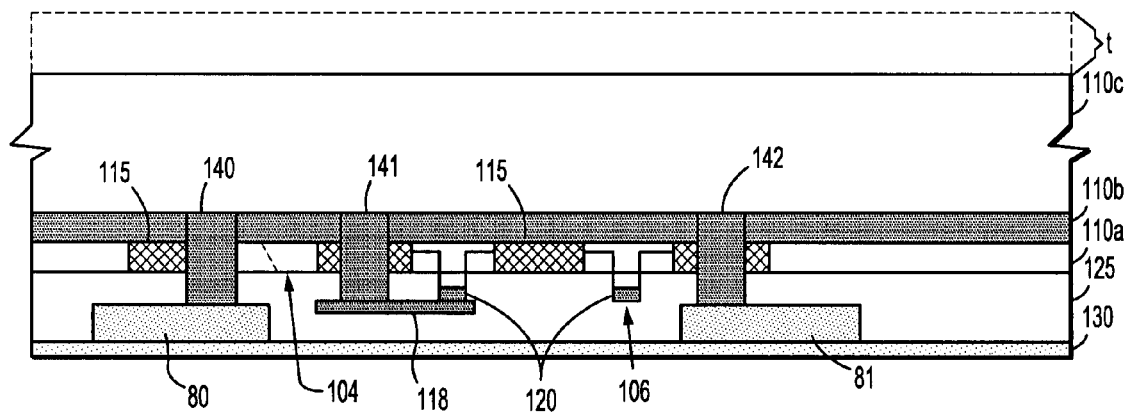
Figure 3E:
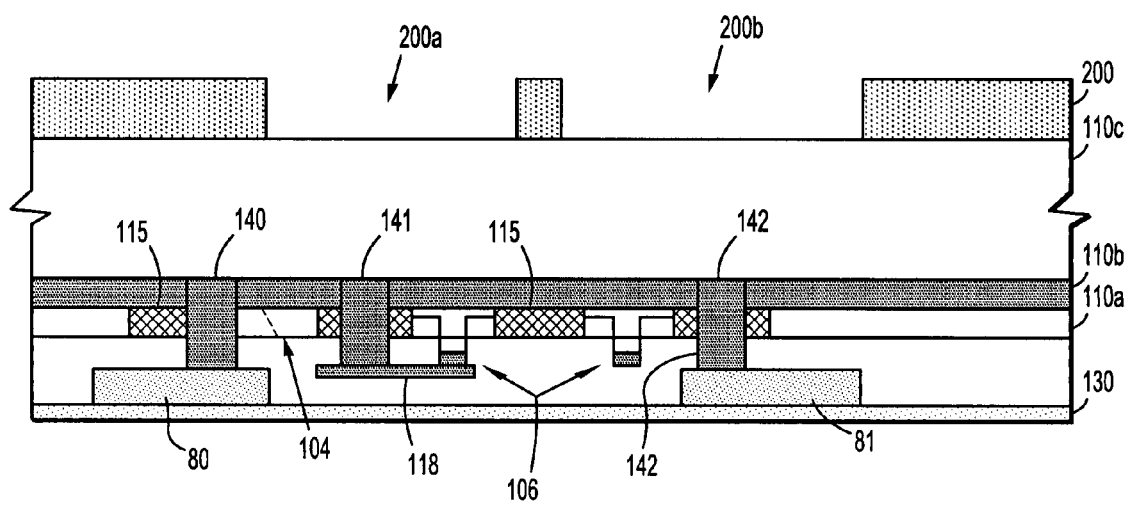
Figure 3F:
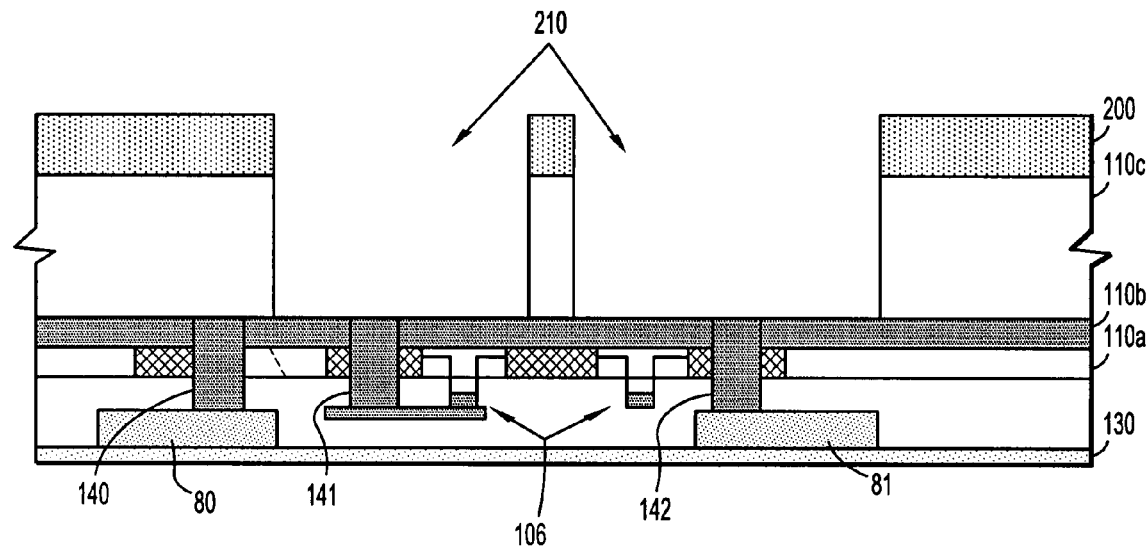
Figure 3G:
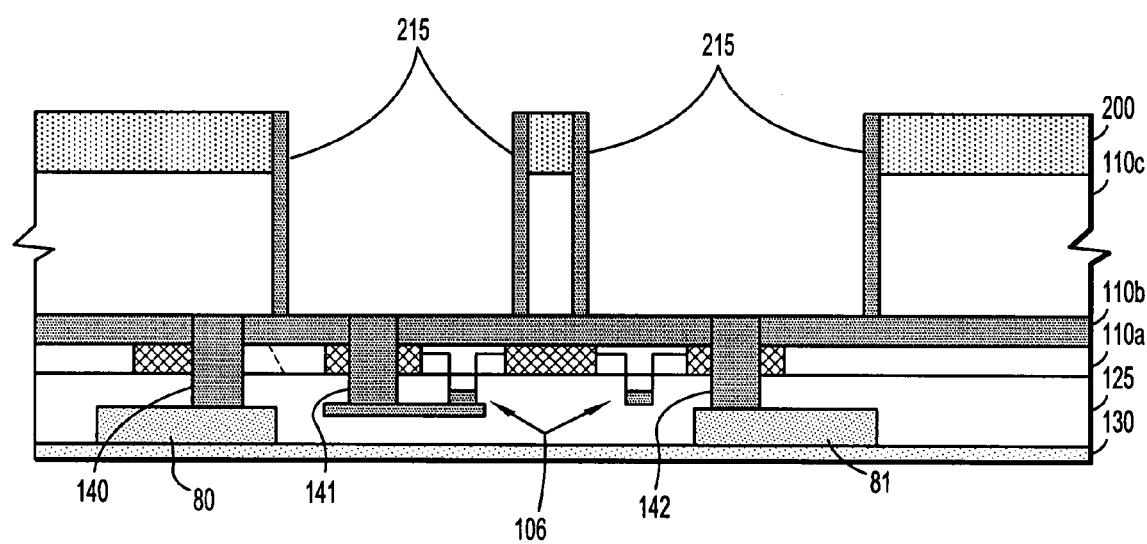
Figure 3H:
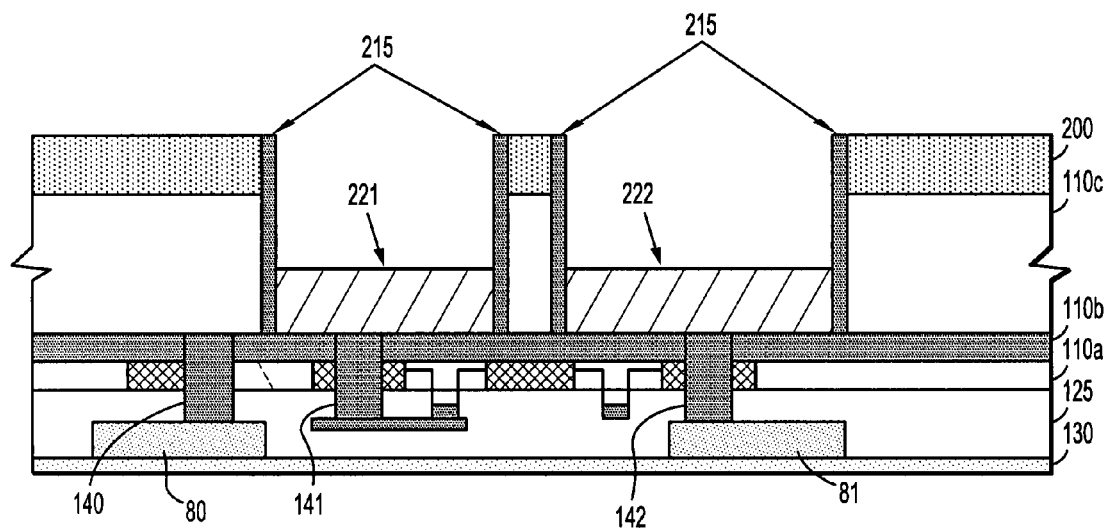
Figure 3I:
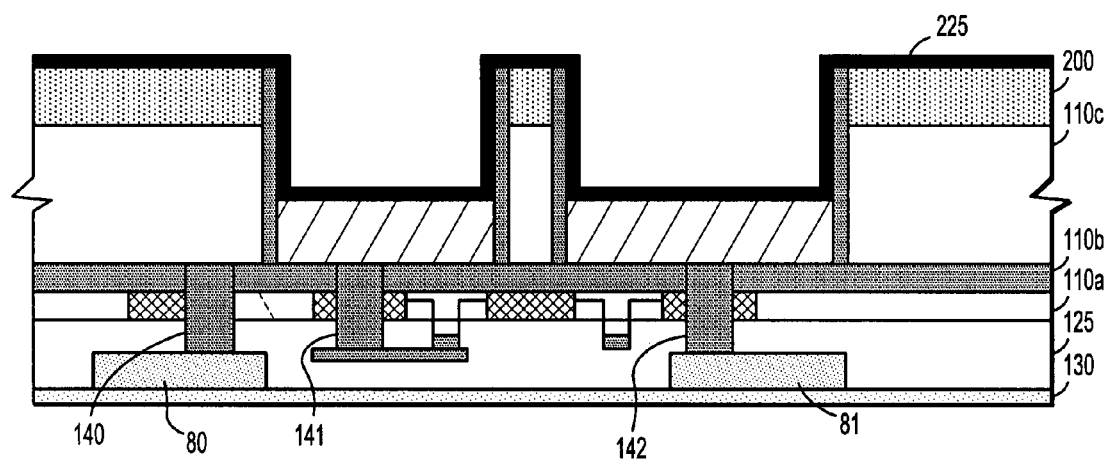
Figure 3J:
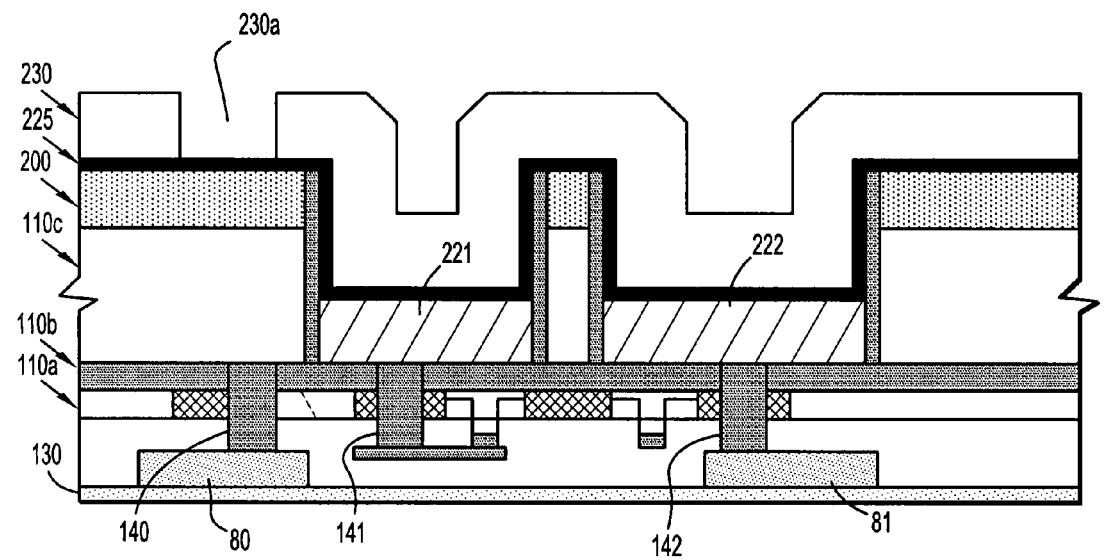
Figure 3K:
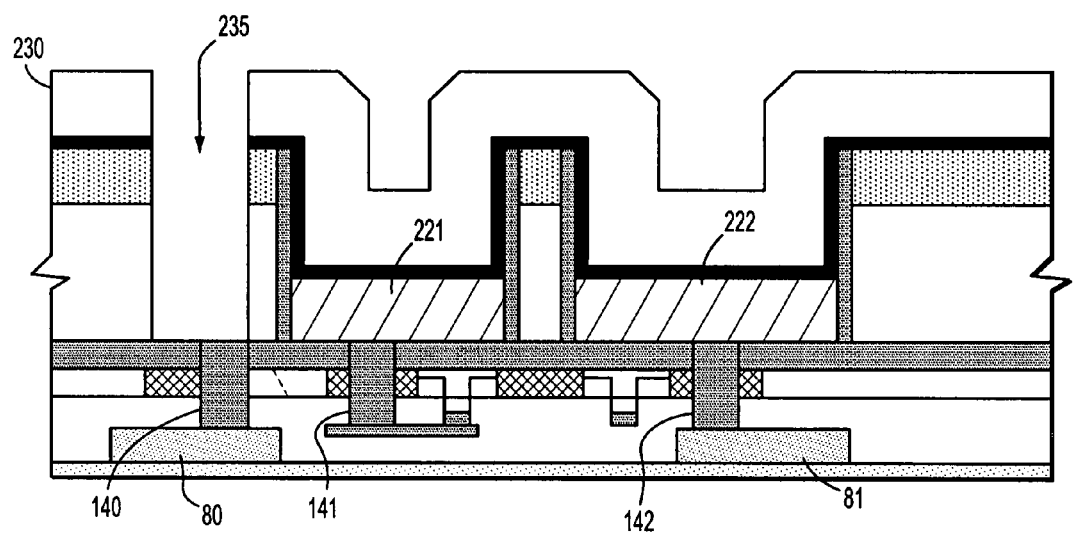
Figure 3L:
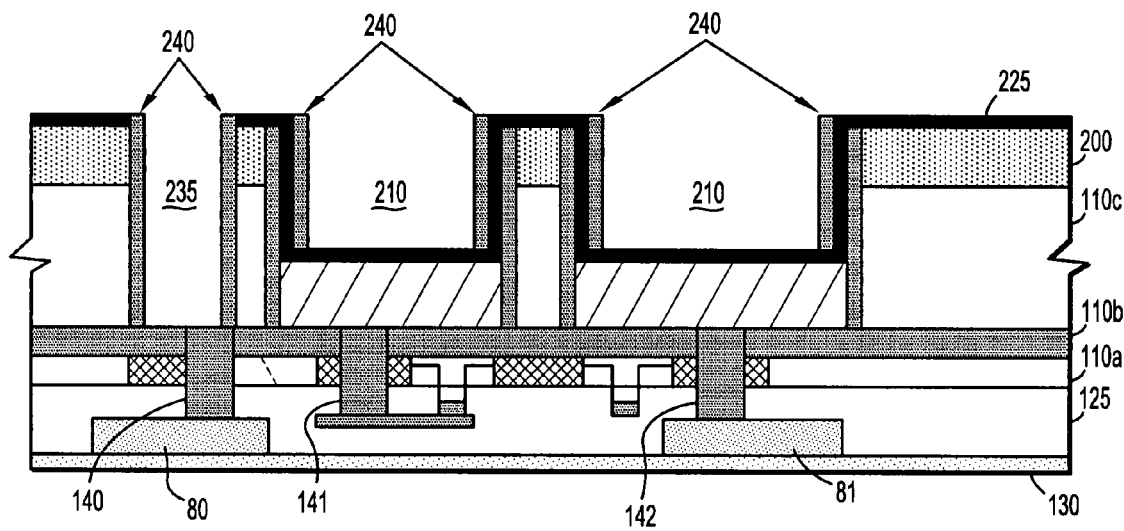
Figure 3M:
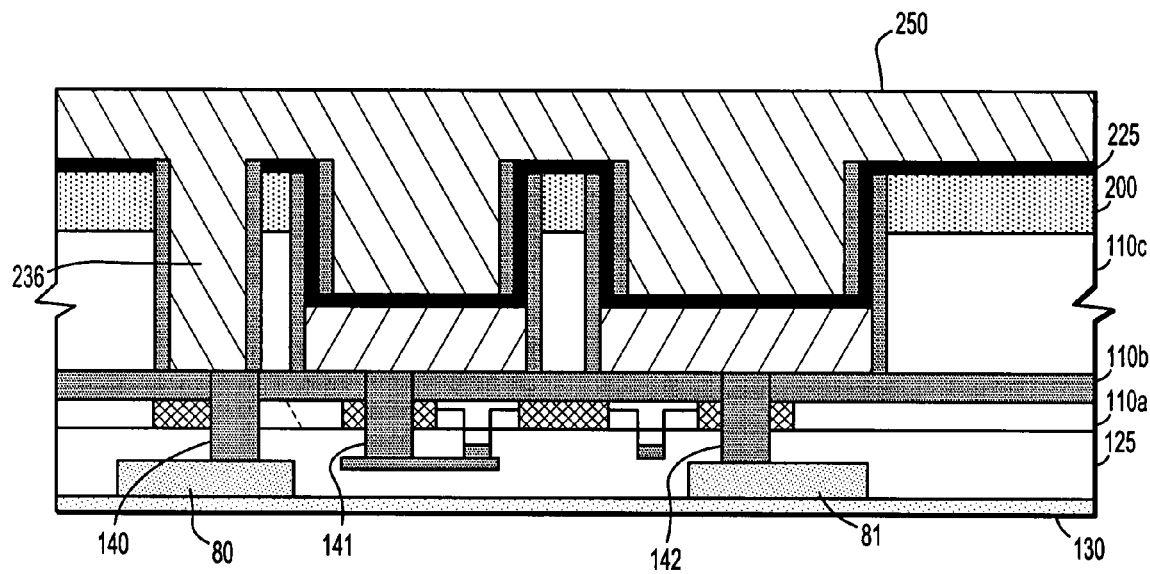
Figure 3N:
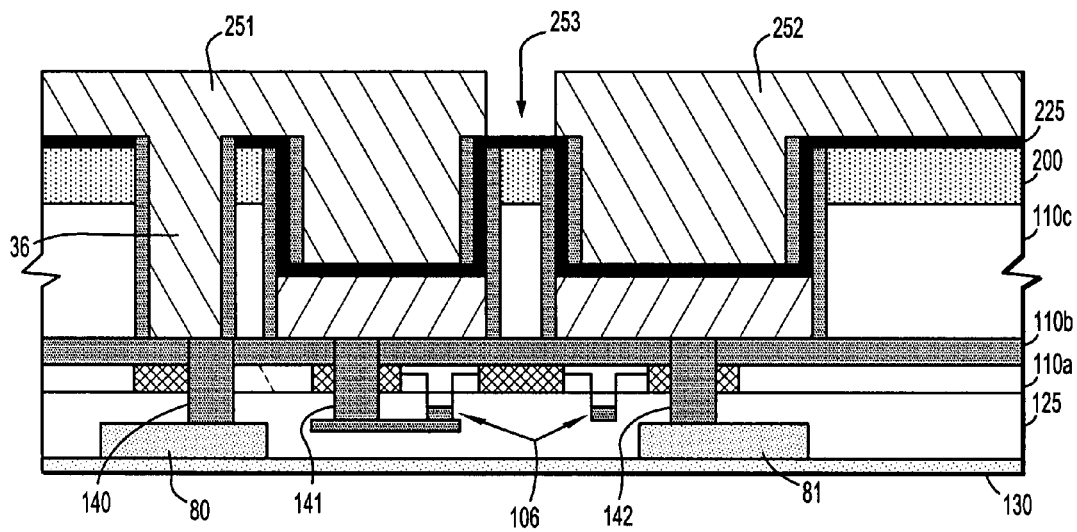
Figure 3O:
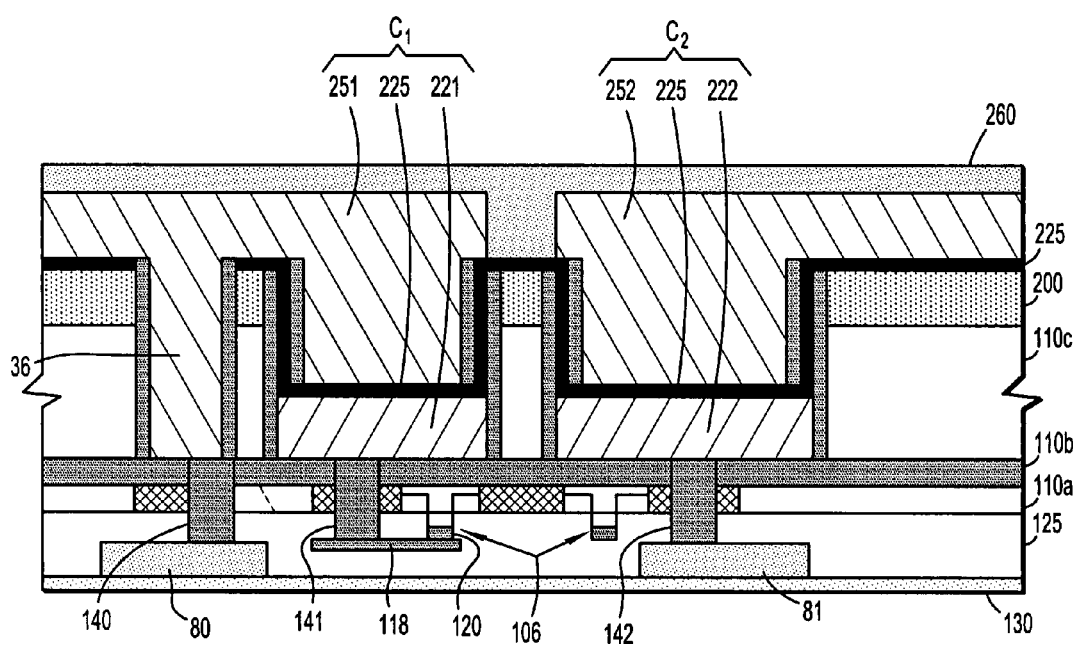

FIGS. 3A~3O schematically illustrate a method for fabricating a semiconductor device with a back-side capacitors connected to front-side circuits using embedded contact structures, according to an exemplary embodiment of the invention. For purposes of illustration, methods for fabricating the semiconductor device (100) illustrated in FIGS. 2A~C will be discussed with reference to FIGS. 3A~3O. In general, FIGS. 3A~3C illustrate various stages of front-side processing to fabricate active components (e.g., transistors) metallization on a front-side of a semiconductor substrate (110), and FIGS. 3D~3O illustrate various stages of back-side processing to fabricate an integrated capacitor on the back-side of the semiconductor substrate (110) and connect the capacitor to the front-side circuit.

FIG. 3A illustrates initial stages of device fabrication starting with the semiconductor substrate (110) comprising silicon layer (110a), BOX layer (110b) and bulk silicon layer (110c). The silicon layer (110a) and BOX layer (110b) together constitute the silicon on insulator (SOI) structure that can be formed using conventional methods for fabricating SOI structures. For example, the SOI substrate can be fabricated using the known SIMOX (separation by implementation of oxygen" process whereby a high energy oxygen implantation process is performed to implant oxygen atoms into the surface of a bare silicon wafer, followed by wafer anneal at a high temperature to form the SOI layer (i.e., silicon layer (110a) on oxide layer (110b)). The thickness of the buried oxide layer (110b) and silicon layer (110a) can vary depending on the device requirements. For example, the thickness of the silicon layer (110a) ranges from approximately 500 angstroms to about 5000 angstroms, and the thickness of the buried oxide layer (110b) can range from approximately 500 angstroms to about 1 micron. The remaining bulk silicon layer (110c) has an initial thickness in a range of about 5 microns to about 15 microns depending on the wafer size (wafer thickness increases as size of wafer increases).

Referring to FIG. 3B, the STI regions (115) and circuit devices (104), (106) are formed on the front-side of the semiconductor substrate (110) using standard FEOL fabrication techniques such as dopant diffusion and implantation, sputtering of polysilicon gate films, oxidations, and associated patterning steps. For example, the STI regions (115) can be formed by depositing thin pad oxide and SiN films and patterning the films to form a mask for etching STI trenches in the silicon layer (110a) down to the BOX layer (110b). A thermal oxidation process is performed to form liner of oxide material on the sidewalls of the trenches followed by an oxide deposition to fill the trenches (via LPCVD or HDP) and subsequent oxide etch back and polishing (e.g., CMP). Thereafter, active components such as diode (104) and transistors (106) are formed in active areas of the silicon layer (110a) defined by the STI regions (115). The circuit components (104), (106) may be formed using standard FEOL fabrication techniques such as dopant diffusion and implantation, sputtering of polysilicon gate films, oxidations, and associated patterning steps.

After the active devices (104), (106) are formed, conventional BEOL (back-end of line) fabrication techniques are used to construct the contact plugs (120), electrical wiring (118), I/O pads (80) and (81), and through-wafer plugs (141~143), embedded in dielectric/insulation material (125), as depicted in FIG. 3C. Referring to FIG. 3C, through-wafer front-side contact plugs (140) are also formed in the dielectric layer (125) but are formed to extend down into the BOX layer (110b). The through-wafer plugs (140~142) are fabricated during initial stages of BEOL processing prior to first level metallization processing to form wiring (118). The plugs (140~142) may be formed by etching via holes from the front-side surface down through the BOX layer (110b) and stopping at the bottom of the BOX layer (110b). Thereafter, a layer of metallic material, such as copper, is deposited to fill the via holes, followed by etch back/polishing to form the contact plugs (140~142). In one exemplary embodiment, the through wafer plugs (140~142)) may be formed with diameters in a range of about 5 microns to about 50 microns, or as wide as possible without resulting in undesirable loss of performance. Indeed, if the through-wafer plugs (140~142)) are made too wide, there may be parasitic coupling between the plugs (140~142) and the silicon layer (110a), for example, resulting in performance loss. This substrate coupling may be reduced when the contact plugs (140~142) are formed through the STI regions (115) of the silicon layer (110a), which serves to isolate the through wafer plugs (140~142) from the silicon material of the substrate layer (110a).

After formation of the through-wafer contacts (140~142) and other device terminal contact plugs (120), processing continues to complete the front-side metallization. For instance, electrical wiring (118) and I/O pads (80, 81) and other inter-level plugs and metallization levels may be formed metallic material such as copper, aluminum, or alloys thereof, using known techniques (e.g., Single Damascene, Dual Damascene, subtractive metal etch) with metallic material such as Cu or Al, for example. After front-side metallization is complete, the wafer is passivated to form a passivation layer (130) over the front-side of the substrate, such as illustrated in FIG. 3C. The passivation layer (130) may be a thick layer of spin-on or deposited material such as an oxide or BPSG (boron phosphorous-doped silicate glass). The passivation layer (130) is formed to provide electrical and mechanical protection to the front-side of the chip for subsequent back-side processing, as will be described now with reference to FIGS. 3D~3P.

Referring to FIG. 3D, the wafer is flipped upside down and the backside of the silicon layer (110c) is subjected to polishing/grinding to remove a certain thickness, t, to thin down the wafer substrate layer (110c). The backside wafer thinning process is optional. The thinning process allows for enhanced thermal dissipation and makes it easier to fabricate backside capacitors. By making the passivation layer (130) sufficiently thick, sufficient mechanical support for the chip can be provided by the passivation layer (130) during backside grinding when the substrate is made significantly thin. Another purpose of backside thinning is to facilitate subsequent backside processes including etching, filling, polishing, etc. In one exemplary embodiment of the invention, the backside can be thinned down to a thickness in a range of about 10% to about 80% of the original thickness.

Referring to FIG. 3E, a hard mask pattern (200) is formed over the backside of the substrate (110) having openings (200a) and (200b) which define capacitor regions. The hard mask pattern (200) may be formed by depositing a layer of hard mask material such as nitride, oxy-nitride or any other similar material having a high selectivity during silicon etching, and then lithographically patterning the hard mask layer to form the hard mask pattern (200). Next, an etch process is performed to anisotropically etch the regions of the bulk silicon layer (110c) exposed by the openings (200a) and (220b) of the hard mask pattern (200) to form trenches (210) through the bulk silicon layer (110c) down to the BOX layer (110b) and expose end portions of the through-wafer contact plugs (141) and (142), such as depicted in FIG. 3F. The silicon etch process may be performed using a C12 plasma etch process to remove the silicon material down to the surface of the buried oxide layer (110b). The etch process may be performed to slightly over etch into the buried oxide layer (110b) to ensure that the end portions of the through-wafer contact plugs (141) and (142) are exposed. The through-wafer contact plugs (141) and (142) (or just end portions thereof) may be made of conductive material such as tungsten, TiW or other suitable conductive material for contact plugs, which is resistive to C12 plasma etching.

Referring to FIG. 3G, the silicon etch is followed by a process to form insulating sidewall spacers (215) on the sidewalls of the trenches (210). The sidewall spacers (215) serve to insulate the silicon (110c) sidewall surfaces in the trenches (210) from conductive material to be subsequently deposited in the trenches (210) to form the capacitor electrodes and prevent short circuits between capacitor plates through the sidewall silicon surfaces of trenches (210). The sidewalls spacers (215) may be formed using known techniques such as blanket depositing a thin conformal layer of an oxide or nitride material and then anisotropically etching the spacer material to remove the material from the horizontal surfaces.

Next, referring to FIG. 3I, the bottom portions of the capacitor trenches (210) are filled with a conductive material such as a metallic material or metal alloy to form capacitor plates (221) and (222), which make electrical contact to the respective through-wafer contact plugs (141) and (142). This process may be performed by depositing a layer of metallic material to fill the trenches (210) and then etching back the metallic material to a desired depth in the trenches (210). The metallic material forming capacitor plates may be tungsten W, Al, Cu, or alloys thereof, etc, or other metallic material having relatively low resistivity so as to form a high-Q inductor with high performance. Prior to metal deposition, a blanket deposition step may be formed to form a thin conformal metallic seed layer over the exposed inner walls of the trenches (210) to facilitate metal plating or adhesion, as is understood by those of ordinary skill in the art.

After formation of capacitor plates (221) and (222), a thin layer of dielectric material (225) is conformally formed over the chip backside, as illustrated in FIG. 3I. The dielectric layer (225) serves as a capacitor dielectric layer for the backside capacitors to be formed. The dielectric layer (225) may be formed of any suitable dielectric material (nitride oxide), or more preferably a high-k dielectric material having a thickness, d, and using any suitable conventional process. For example, the dielectric layer (225) may be a layer of $Al_2O_3$ having thickness in a range of about 5 nm to about 50 nm and formed using a CVD deposition process. It is to be understood that the width of the capacitor trenches (210) and thickness of dielectric layer (225), for example, will vary depending on the desired capacitance.

Referring to FIG. 3J, etch mask (230) is formed having an opening (230a) that is aligned to the through-wafer contact plug (140). The mask (230) may be a layer of photoresist. An etch process is performed using the etch mask (230) to etch the exposed portions of layers (225), (200) and (110c) to form an opening (235) down to the Box layer (110b) and expose the end of the through-wafer contact plug (140), such as shown in FIG. 3K.

Next, referring to FIG. 3L, a second spacer formation process is performed to form sidewall spacers (240) on the silicon sidewall surfaces of the opening (235) and the upper sidewall surface regions of the capacitor trenches (210). Next, a layer of conductive material (250) is deposited to fill the opening (235) and the upper portions of capacitor trenches (210), such as illustrated in FIG. 3M. This conductive material (250) is used to form bottom capacitor plates and form a backside plug (236) that makes electrical contact to front-side circuitry via the through-wafer plug (140). In particular, as depicted in FIG. 3N, an etch process is performed to pattern the conductive layer (250) by forming one or more isolation trenches (253), as necessary, to form separate bottom capacitor plates (251) and (252). The bottom capacitor plate (251) is electrically connected to the input pad (80) via the conductive plug (236) and is electrically isolated from the bottom capacitor plate (252) by formation of trench (253).

Thereafter, as illustrated in FIG. 3O, a protective insulating layer (260) is formed to cover the backside surface of the chip and fill the isolation trench (253). Various materials such as silicon oxide, silicon nitride, polyimide, etc. may be used to form the insulating layer (250), which serve to provide electrical and mechanical protection to the back-side features, and mechanical support to the chip (100).

The resulting structure in FIG. 3O illustrates two separate capacitors—a first capacitor C1 formed by top/bottom capacitor plates 221/251 with capacitor dielectric layer (225) interposed there between and a second capacitor C2 formed by top/bottom capacitor plates 222/252 with capacitor dielectric layer (225) interposed there between. In the exemplary embodiment of FIG. 1, the capacitor C1 may be a DC blocking capacitor where the top plate (221) is connected to the gate of a MOSFET device (106) (input of receiver) via through-wafer plug (141), wiring (118) and gate contact (120) and wherein the bottom plate (251) is connected to the p junction (104a) of diode (104) and the I/O pad (80) via the backside plug (236) and through-wafer plug (140). The second capacitor C1 may be a decoupling capacitor having a bottom plate (252) tied to ground and top plate (222) connected to the power supply pad (81) via the through-wafer contact plug (142). It is to be understood that a plurality of backside capacitors may share a commonly connected bottom plate electrode in instance wherein the bottom plate electrode are commonly connected to ground, for example.

The resulting structure in FIG. 3O is then subjected to further processing to remove the passivation layer (130) on the front side of the chip and form solder balls (90) and (91) on the respective I/O pads (80) and (81), resulting in the structure depicted in FIG. 2A. The solder balls (90) and (91) may be C4's that are formed using known techniques, enabling flip-chip bonding of the IC chip (100) to a PCB or package substrate.

Figure 4:
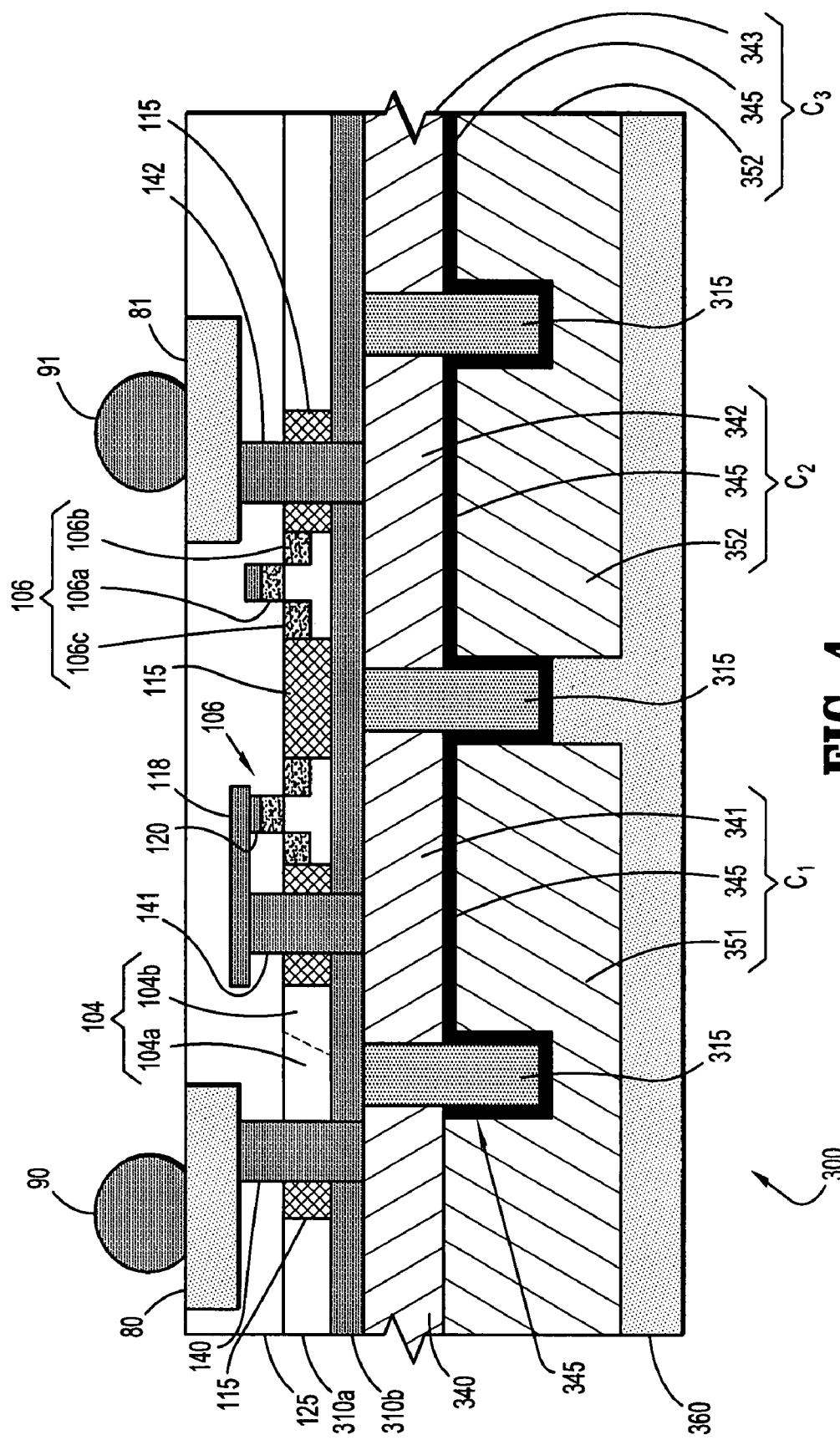
FIG. 4 schematically illustrates a semiconductor IC chip having on-chip back side capacitors according to another exemplary embodiment of the invention.
Figure 5A:
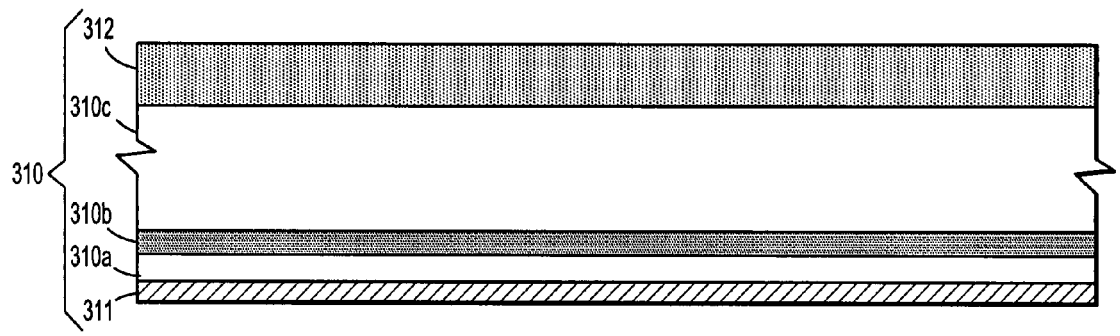
FIGS. 5A~5L schematically illustrate a method for fabricating a semiconductor IC chip having on-chip back side capacitors according to another exemplary embodiment of the invention.

FIG. 4 is a schematic cross-sectional side view of an IC chip (300) having high-Q capacitors that are formed on the chip back-side, according to another exemplary embodiment of the invention. FIG. 4 illustrates an exemplary structure of the IC chip (300) that is formed using exemplary methods as discussed below with reference to FIGS. 5A~5K starting from a prefabricated SOI wafer structure (310) comprising a thin layer of silicon (310a) and a buried oxide (BOX) layer (310b) (as depicted in FIG. 4), as well as a bulk silicon layer (310c) and other initial protective insulation layers (311) and (312) as depicted in FIG. 5A. As explained below, the exemplary fabrication process of FIGS. 5A~5L eliminates certain backside processing steps (e.g., silicon etching and sidewall spacer processing) that are performed in the exemplary methods discussed above for FIGS. 3A~3O for fabricating backside capacitor structures.

Referring to FIG. 4, for ease of illustration and discussion, the IC chip (300) is depicted as having a front-side integrated circuit architecture (active components and BEOL interconnection structure) similar to that discussed above and depicted in FIGS. 2A~2C. The front-side integrated circuit includes STI regions (115), active components (104) and (106), contact plugs (120), electrical wiring (118), I/O pads (80) and (81), dielectric/insulation material (125), solder balls (90) and (91), and through-wafer contact plugs (140, 141, 142) such as described in detail above with reference to FIG. 2A, for example. In this regard, FIG. 4 can be viewed as another exemplary embodiment of the front-end of the receiver (31) of the integrated circuit (30) of FIG. 1 having input pads (80), ESD devices (70) and on-chip DC blocking capacitors (50), etc.

A plurality of integrated capacitor structures C1 and C2 and C3 are formed on the backside of the chip (300). The capacitor regions are defined by insulating columns (315) that are formed on the backside extending from the BOX layer (310b). A first metallization layer is formed to provide upper capacitor plates (341), (342) and (343) of respective capacitors C1, C2 and C3, and backside contact (340). A second metallization and patterning process forms bottom capacitor plates (351) and (352). A dielectric film (345) serves as a capacitor dielectric layer for capacitors C1, C2 and C3. A back-side passivation layer (360) is formed to protect and isolate the capacitor electrodes (351) and (352).

In the exemplary embodiment of FIG. 4, the first capacitor C1 is a DC blocking capacitor formed by the upper and bottom capacitor plates (341) and (351) and portion of the dielectric layer (345) interposed there between. The upper plate (341) contacts the exposed end of through-wafer plug (141) and the bottom capacitor plate (351) is electrically connected to the exposed end of the through wafer plug (140) via the contact (340). The portion of the dielectric layer (345) initially deposited over the contact (340) is removed prior to the second metallization so that the bottom plate (351) directly contacts the contact (340).

Moreover, the second capacitor C2 is a decoupling capacitor formed by the upper capacitor plate (342) and the bottom capacitor plate (352) and the portion of the dielectric layer (345) interposed there between. The through-wafer plug (142) connects the first electrode (3422) to I/O pad (81) to which DC power is applied, and wherein the second electrode (352) is connected to ground. In addition, the third capacitor C3 is formed by the upper capacitor plate (343) and bottom capacitor plate (352) with a portion of the dielectric layer (345) interposed there between. In the exemplary embodiment, the bottom capacitor plate (352) is commonly shared by capacitors C2 and C3 (or more), wherein capacitor C3 may be connected to some portion of the front-side circuit via a through-wafer plug (not shown). For example, capacitor C3 may be another decoupling capacitor that is connected to another power supply pad on the front side of the IC chip (300).

FIGS. 5A~5L schematically illustrate a method for fabricating a semiconductor device with a back-side capacitors connected to front-side circuits using embedded contact structures, according to another exemplary embodiment of the invention. For purposes of illustration, methods for fabricating the semiconductor device (300) illustrated in FIG. 4 will be discussed with reference to FIGS. 5A~5L. FIG. 5A illustrates initial stages of device fabrication starting with the semiconductor SOI substrate (310) comprising a front side silicon layer (310a), a buried oxide layer (310b), a bulk silicon layer (310c), an insulating protective film (311) (which is formed on the top and side surfaces of the silicon layer (310a) to seal/encapsulate the silicon layer (310a)) and a hard mask layer (312) formed on the backside of the wafer substrate (310). FIG. 5A schematically depicts one type of commercially available prefabricated SOI wafer that can be used to form the exemplary IC chip (300) of FIG. 4 using the exemplary methods described hereafter.

Figure 5B:
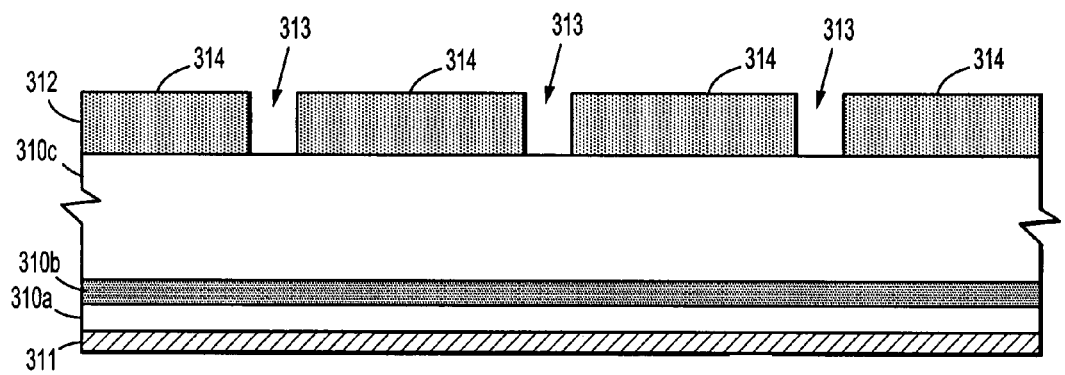
Figure 5C:
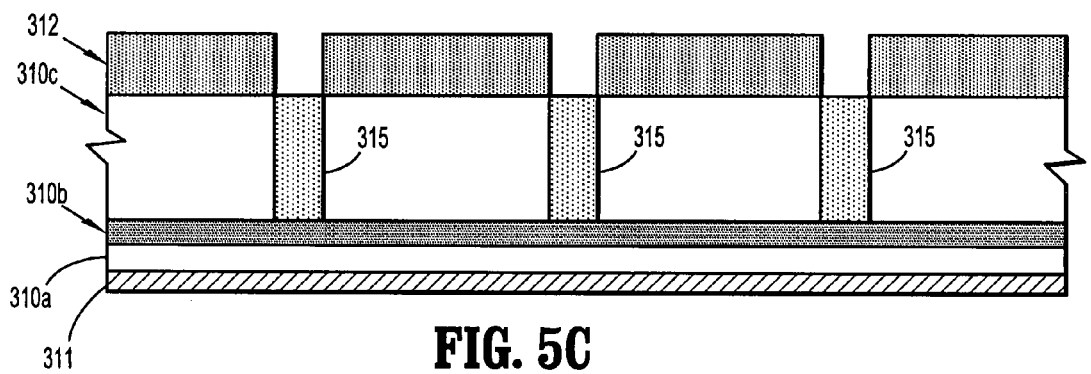
Figure 5D:
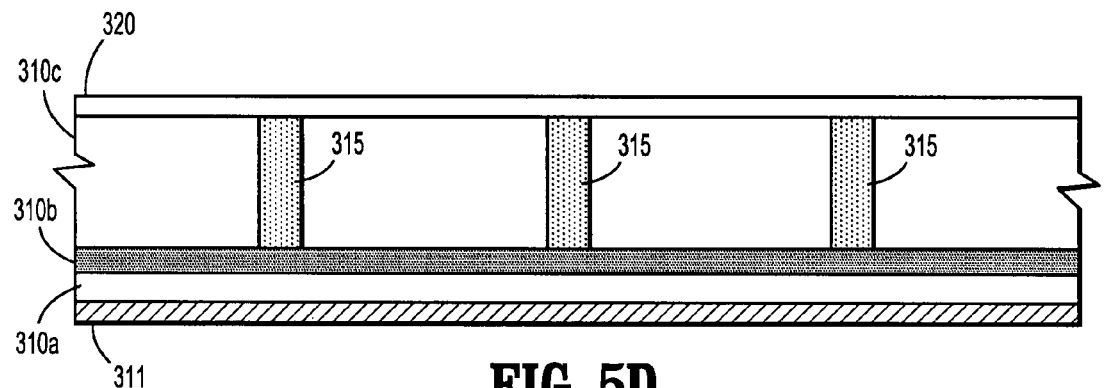

Referring to FIG. 5B, backside processing begins by patterning the hard mask layer (312) to form openings (313) that define boundaries between capacitor regions defined by remaining mask patterns (314). Next, insulating columns (315) are formed through the bulk silicon layer (310c) down to the buried oxide layer (310b). The insulating columns (315) may be oxide columns that are formed using, for example, a porous oxidation process whereby the exposed bulk silicon material aligned to the openings (313) is converted to an oxide. Other conventional methods enabling low-temperature, low-stress formation of isolation structures may be used. In another embodiment, the insulating columns (315) can be formed using the hard mask pattern (312) to etch trenches in the exposed regions of the silicon layer (310c) down to the BOX layer (310b) and fill the trenches with an insulating material such as an oxide material. The insulating columns (315) define the capacitor boundary regions. After formation of the insulating columns (313), the hard mask pattern (312) is removed and the backside of the wafer (310) is coated with a protective film (320), such as depicted in FIG. 5D.

Figure 5E:
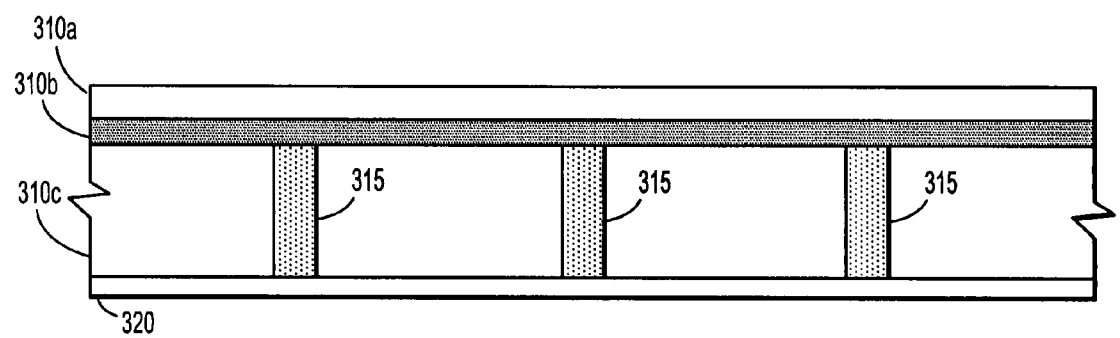
Figure 5F:
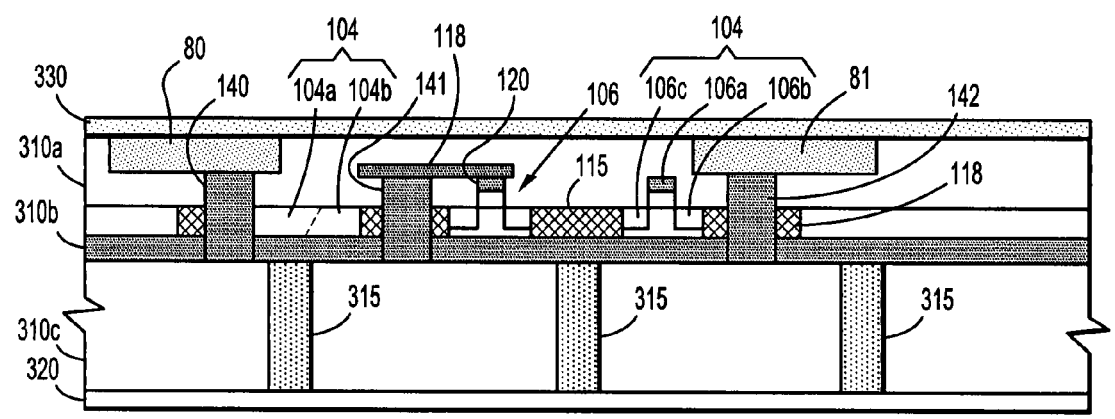

Following backside passivation, fabrication commences with front side processing. For instance, as depicted in FIG. 5E, the protective layer (311) is removed to expose the front side silicon layer (310a). Next, FEOL and BEOL processing is performed to fabricate active devices and interconnections, as illustrated in FIG. 5F. The integrated circuit components and interconnects can be fabricated using methods discussed above. After formation of the front-side integrated circuit, a protective film (330) is formed over the front-side of the substrate (310) to protect the front-side during subsequent backside processing to form capacitor structures.

Figure 5G:
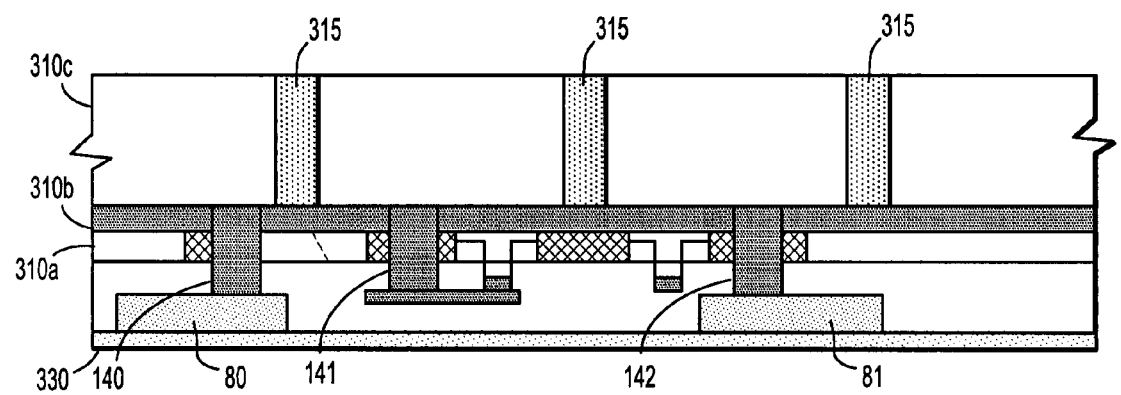
Figure 5H:
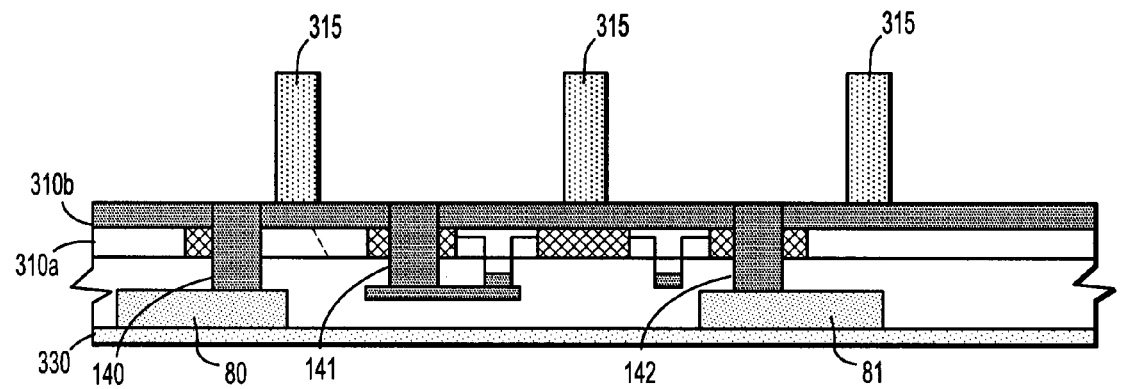

In particular, referring to FIG. 5G, the backside protective film (320) is removed to expose the bulk silicon layer (310c). An etch process is then performed to remove the portions of the bulk silicon layer (310c) in the capacitor regions defined by the oxide columns (315). The bulk silicon material of layer (310c) is removed in the capacitor regions down to the buried oxide layer (310b), as illustrated in FIG. 5H. This process is used to form capacitor pockets defined by the oxide columns (315). In another exemplary embodiment wherein the backside layer is entirely formed on insulating material, the structure in FIG. 5H can be directly formed by forming an etch mask that defines the capacitor regions and then etching the backside insulation layer to form the insulating columns (315).

Figure 5I:
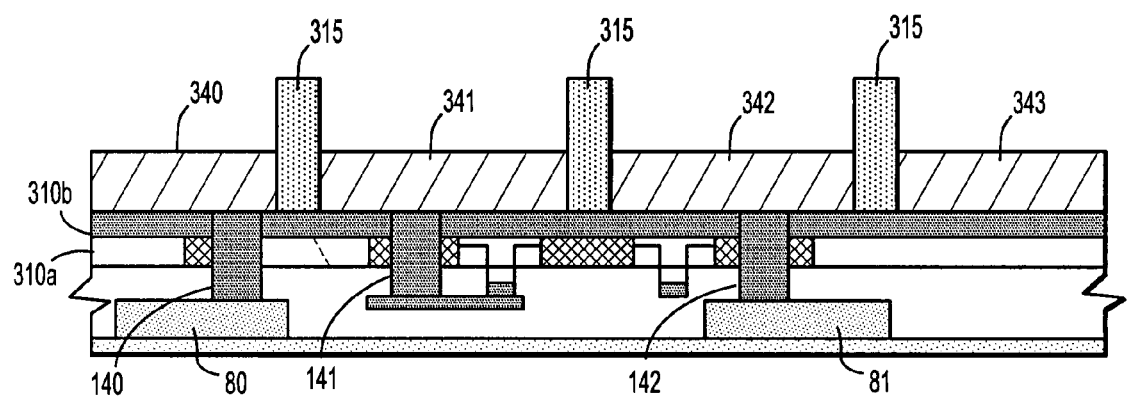
Figure 5J:
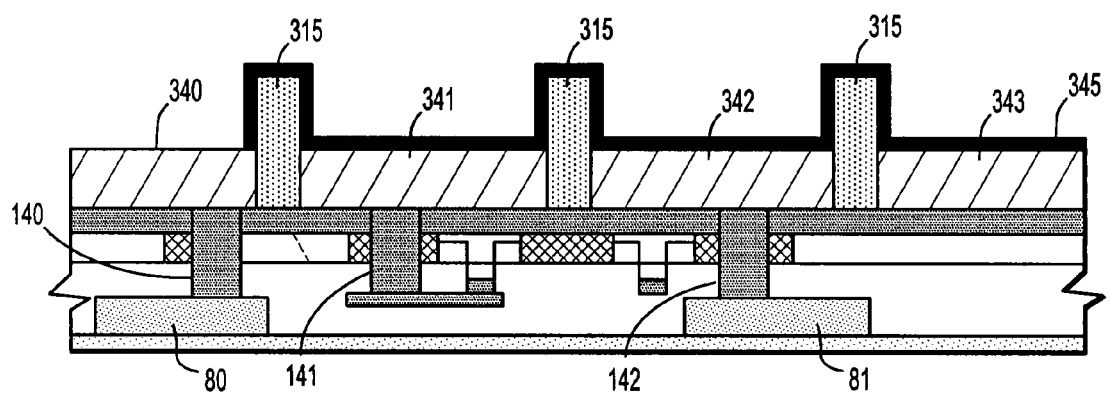

After forming/exposing the insulating columns (315), a first metallization process is performed to deposit a metallic material over the backside followed by an etch-back to form conductive plate structures (340~343), resulting in the structure depicted in FIG. 5I. Thereafter, a layer of dielectric material (345) (preferably high-k dielectric) is blanket deposited over the backside plate structures (340~343) and exposed surfaces of the capacitor insulating frame (315). As noted above, the metallic plates (341), (342) and (343) are upper capacitor plates for backside capacitors C1, C2 and C3 (depicted in FIG. 4), whereas the metallic plate (340) is used to form an contact between the through-wafer plug (140) and a bottom capacitor plate. The resulting structure is depicted in FIG. 5J, where the portion of the dielectric layer (345) formed over the metallic plate (340) is removed prior to the second metallization process. It is to be noted that in contrast to the exemplary fabrication process of FIGS. 3A~3O, a second etch process is not needed to form a contact opening to the through-wafer plug (140), as the region for forming contact (340) is formed as part of the first etch process which exposes the ends of all through-wafer plugs (140~142). Moreover, sidewall spacer fabrication steps are not needed to line silicon trench surfaces as the insulating columns are used to define and separate the capacitor regions (as opposed to the silicon trenches form in the backside bulk silicon layer). Indeed, the dielectric layer (345) is formed over the exposed columns (315) and then removed from the first level metallic plates that are to make contact to bottom plates of the capacitors formed as part of the second metallization process.

Figure 5K:
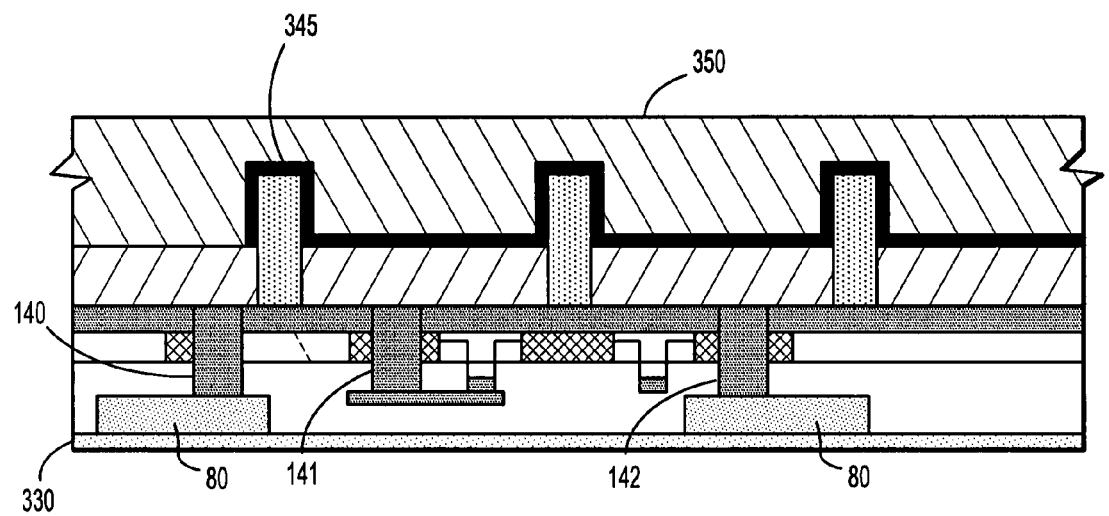
Figure 5L:
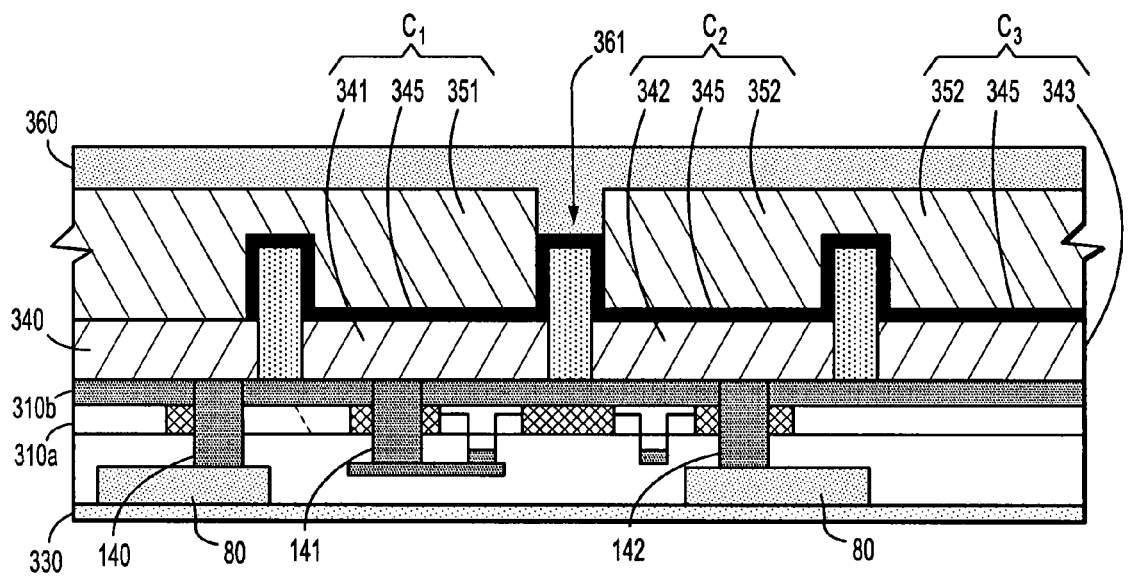

Referring to FIG. 5K, a second metallization process is performed to deposit and planarize a layer of metallic material (350) used to form the bottom capacitor plates. Next, a mask pattern is formed over the second metal layer (350) and used to form isolation trenches (361) in the second metallization layer (350) and form separate capacitor bottom plates (351) and (352), for example, as shown in FIG. 5L. A layer of insulating material (360) is deposited to fill the trenches (361) and isolate the bottom capacitor plates (351) and (353). The resulting structure in FIG. 5L is then subjected to further processing to remove the passivation layer (330) on the front side of the chip and form solder balls (90) and (91) on the respective I/O pads (80) and (81), resulting in the structure depicted in FIG. 4. The solder balls (90) and (91) may be C4's that are formed using known techniques, enabling flip-chip bonding of the IC chip (300) to a PCB or package substrate.

It is to be appreciated that there are various advantages associated with exemplary methods of the invention for fabricating semiconductor devices with backside capacitor structures according to the invention. For instance, high-density integration can be achieved by forming the large area capacitors, if needed, on the chip back-side and thus, saving chip front-side area for more dense packaging of circuit components and interconnections. Moreover, back-side capacitors are disposed in relatively close relation to the front-side integrated circuit such that the length of interconnects (through wafer plug contacts) are minimized and thus minimizing the series resistance of the through-wafer interconnect structures.

Moreover, the back-side processing for fabricating the capacitors is decoupled from the front-side processing for fabricating the integrated circuit on the chip active surface. This allows the fabrication of the capacitor components with the desired conductive materials and embedding dielectric and structural framework (capacitor plate material, plate thickness and area, and dielectric material, etc.) to be optimized for high quality performance independent from other chip fabrication steps. For instance, the back-side metallization which comprise the capacitor plates can be selected with a high conductive metal such as copper or aluminum and embedded in insulating material having desirable properties to achieve a desired performance. The insulating material can be chosen to be a low-K material that can easily be deposited on the back-side to large thicknesses to achieve low parasitic environment for the capacitors. Moreover, by using metallic material such as copper with good thermal conductivity, the capacitor plates on the backside can provide increased thermal cooling and heat dissipation.

Although exemplary embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

We claim:

1. A semiconductor device, comprising:
a semiconductor substrate having a front side, a back side, and a buried insulating layer interposed between the front and back sides of the substrate;
an integrated circuit formed on the front side of the semiconductor substrate;
an integrated capacitor formed on the back side of the semiconductor substrate, the integrated capacitor including a first metallic plate in contact with the buried insulating layer, a second metallic plate, and a dielectric formed therebetween; and
an interconnection structure formed through the buried insulating layer to connect the integrated capacitor to the integrated circuit.

2. The device of claim 1, wherein the semiconductor substrate is SOI (silicon on insulator) structure.

3. The device of claim 1, wherein the interconnection structure comprises a buried metallic plug having a first end connected to the integrated circuit on the front side of the substrate and a second end connected to a metallic capacitor plate of the integrated capacitor on the back side of the substrate, wherein the second end of the buried metallic plug is substantially coplanar with a back side surface of the buried insulation layer.

4. The device of claim 3, wherein the first end of the buried metallic plug is connected to an I/O pad or power supply pad formed on a surface of the front side of the substrate.

5. The device of claim 1, wherein a capacitor dielectric layer is disposed between the first and second metallic plates.

6. The device of claim 5, wherein the first and second metallic plates are electrically connected to separate first and second interconnection structures exposed on the back side of the substrate through the buried insulating layer.

7. The device of claim 5, wherein the first and second metallic plates are formed in a capacitor region defined by insulating material on the backside the substrate surrounding the first and second metallic plates.

8. The device of claim 7, wherein the capacitor region is defined by a trench formed in an insulating layer on the backside of the substrate.

9. The device of claim 5, wherein the first and second metallic plates are formed in a capacitor region defined by semiconductor material on the back side of the substrate surrounding the first and second metallic plates.

10. The device of claim 9, wherein the capacitor region is defined by a trench formed in a layer of silicon on the backside of the substrate.

11. The device of claim 10, further comprising an insulating spacer formed on a side wall of the trench.

12. The device of claim 1, wherein the integrated capacitor is a DC blocking capacitor.

13. The device of claim 1, wherein the integrated capacitor is a decoupling capacitor.

14. The device of claim 1, wherein the integrated capacitor is a stacked structure formed on a back side surface of the buried insulating layer.

15. A method of forming a semiconductor device, comprising:
forming an integrated circuit on a front side of a semiconductor substrate;
forming an integrated capacitor on a back side of the semiconductor substrate, the integrated capacitor including a first metallic plate in contact with the buried insulating layer, a second metallic plate, and a dielectric formed therebetween; and
forming an interconnection structure through a buried insulating layer interposed between the front and back sides of the substrate, which connects the integrated capacitor to the integrated circuit.

16. The method of claim 15, wherein forming the interconnection structure comprises forming a buried metallic plug having a first end connected to the integrated circuit on the front side of the substrate and a second end connected to a metallic capacitor plate of the integrated capacitor on the back side of the substrate, wherein the second end of the buried metallic plug is substantially coplanar with a back side surface of the buried insulation layer.

17. The method of claim 16, comprising forming an metallic I/O or power pad on a surface of the front side of the substrate such that the pad is in direct contact with an end portion of the buried metallic plug.

18. The method of claim 15, wherein forming the integrated capacitor comprises forming a stacked capacitor structure having the first and second metallic plates with a capacitor dielectric layer disposed between the first and second metallic plates.

19. The method of claim 18, wherein the first metallic plate is formed by depositing a metallic material on a region of a back side surface of the buried insulating layer that is aligned to an exposed end portion of the interconnection structure.

* * * * *